(12) United States Patent
Wang et al.

(10) Patent No.: US 6,597,212 B1
(45) Date of Patent: Jul. 22, 2003

(54) DIVIDE-BY-N DIFFERENTIAL PHASE INTERPOLATOR

(75) Inventors: David Y. Wang, San Jose, CA (US); Yu-Chi Cheng, Fremont, CA (US)

(73) Assignee: Neoaxiom Corporation, San Jose, CA (US)

( * ) Notice: Subject to any disclaimer, the term of this patent is extended or adjusted under 35 U.S.C. 154(b) by 0 days.

(21) Appl. No.: 10/097,492

(22) Filed: Mar. 12, 2002

(51) Int. Cl.[7] ............................................... H03B 19/00
(52) U.S. Cl. ......................................... 327/117; 377/47
(58) Field of Search ................................ 327/113, 114, 327/115, 117, 118; 377/47, 48

(56) References Cited

U.S. PATENT DOCUMENTS

| | | | | |
|---|---|---|---|---|
| 4,002,926 A | * | 1/1977 | Moyer ......................... | 377/47 |
| 4,741,004 A | * | 4/1988 | Kane .......................... | 377/110 |
| 4,845,727 A | * | 7/1989 | Murray ........................ | 377/43 |
| 5,524,037 A | * | 6/1996 | Donig et al. ................. | 377/108 |
| 5,554,945 A | | 9/1996 | Lee et al. .................... | 327/105 |
| 5,661,426 A | * | 8/1997 | Ichimaru ..................... | 327/203 |
| 5,818,293 A | * | 10/1998 | Brehmer et al. ............. | 327/202 |
| 5,864,246 A | | 1/1999 | Anderson .................... | 327/122 |
| 5,907,589 A | * | 5/1999 | Koifman et al. .............. | 377/47 |
| 6,002,279 A | | 12/1999 | Evans et al. ................. | 327/144 |
| 6,035,409 A | | 3/2000 | Gaudet ........................ | 713/401 |
| 6,111,445 A | | 8/2000 | Zerbe et al. ................. | 327/231 |
| 6,122,336 A | | 9/2000 | Anderson .................... | 375/371 |
| 6,125,157 A | | 9/2000 | Donnelly et al. ........... | 375/371 |
| 6,163,182 A | * | 12/2000 | Canard et al. .............. | 327/117 |
| 6,268,752 B1 | * | 7/2001 | Takahashi et al. .......... | 327/202 |
| 2001/0009275 A1 | | 7/2001 | Jung et al. .................. | 257/1 |

OTHER PUBLICATIONS

S. Sidiropoulos et al., "A Semi–Digital Dual Delay Locked Loop", IEEE Journal of Solid State Circuits, Nov., 1997, Version 2.1, 22 pages.

* cited by examiner

*Primary Examiner*—Timothy P. Callahan
*Assistant Examiner*—Cassandra Cox
(74) *Attorney, Agent, or Firm*—Thomas Schneck

(57) ABSTRACT

A phase interpolator circuit that produces $2^m$ phase resolution elements using a control signal that has less than m bits. The circuit combines the function of a divide-by-N circuit with a phase interpolation circuit enabled by the use of a higher-speed clock as an input. By performing phase interpolation at a high speed and then slowing down the speed for the subsequent circuits, the phase resolution increases and fewer control bits are required.

16 Claims, 5 Drawing Sheets

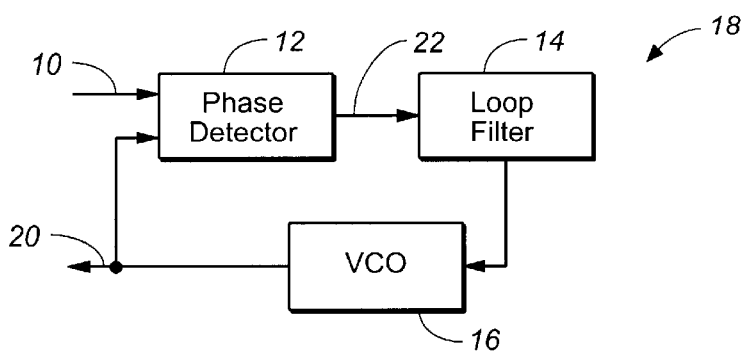
FIG._1 (PRIOR ART)
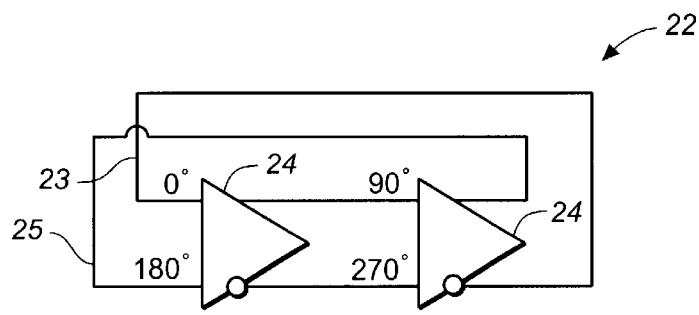
FIG._2 (PRIOR ART)
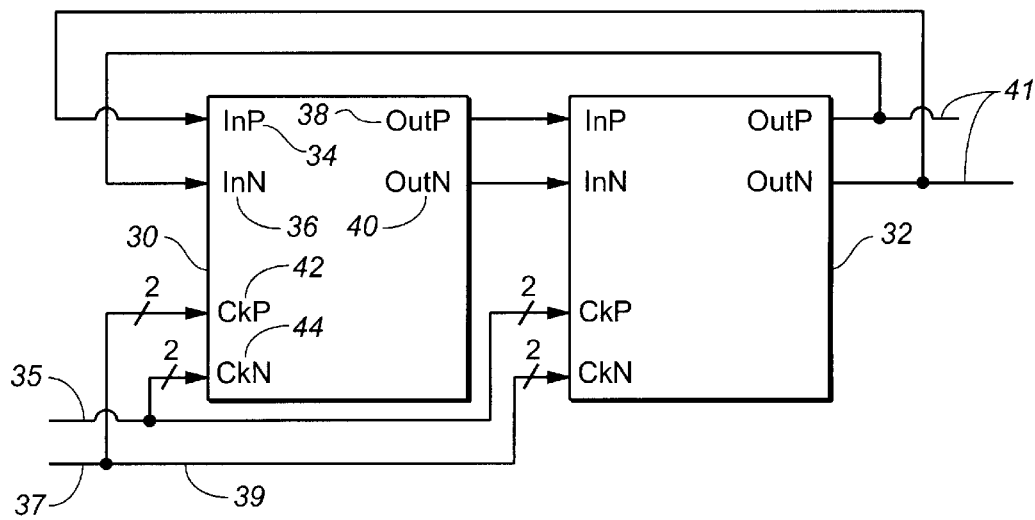
FIG._4

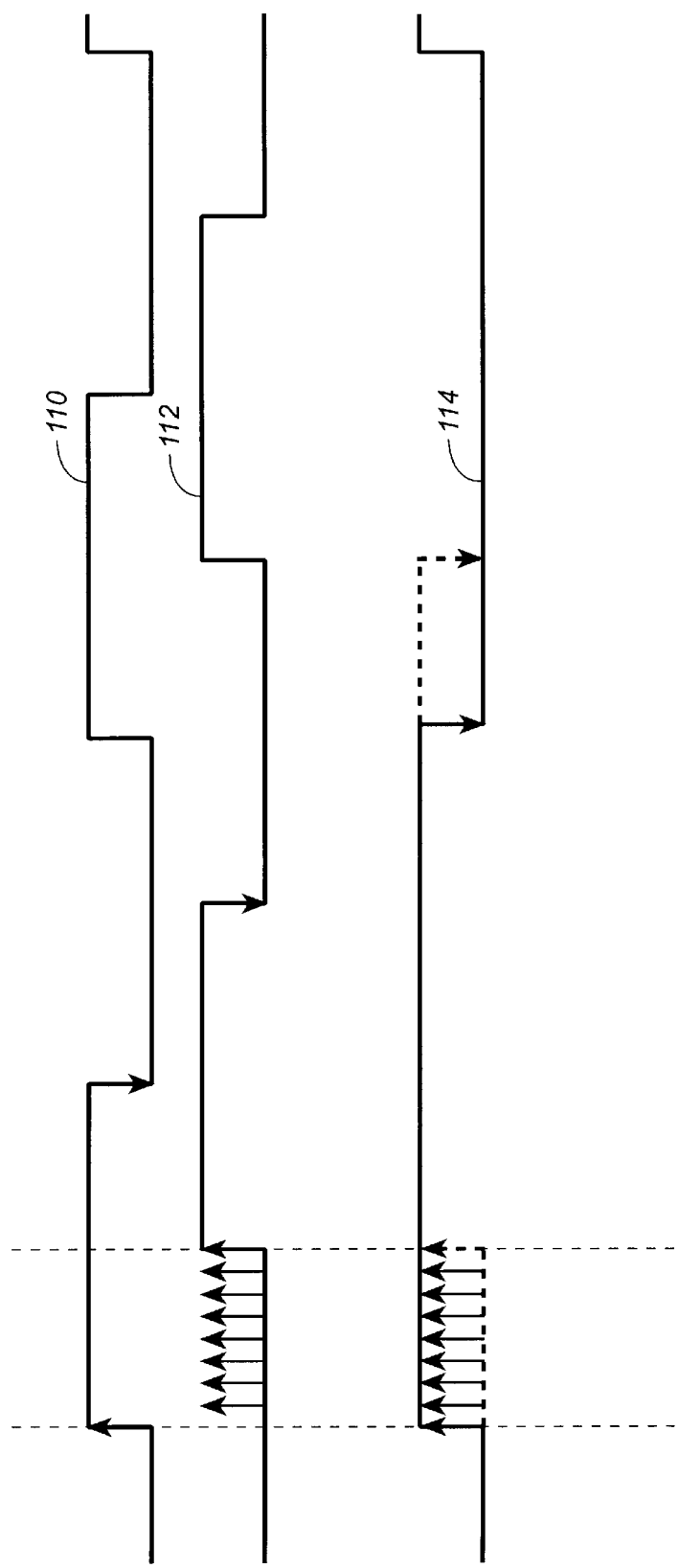
FIG._3

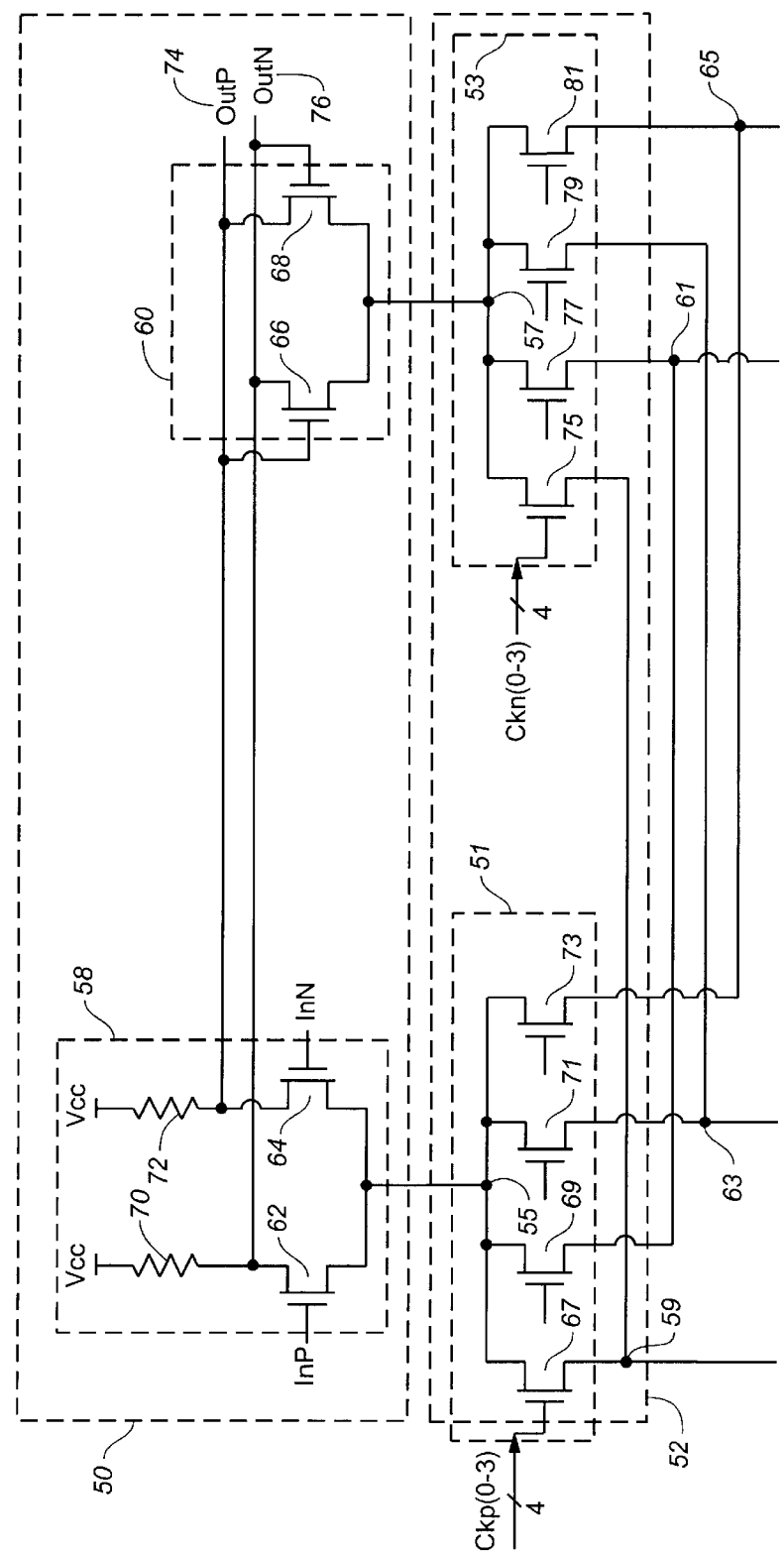
FIG._5
FIG._5A

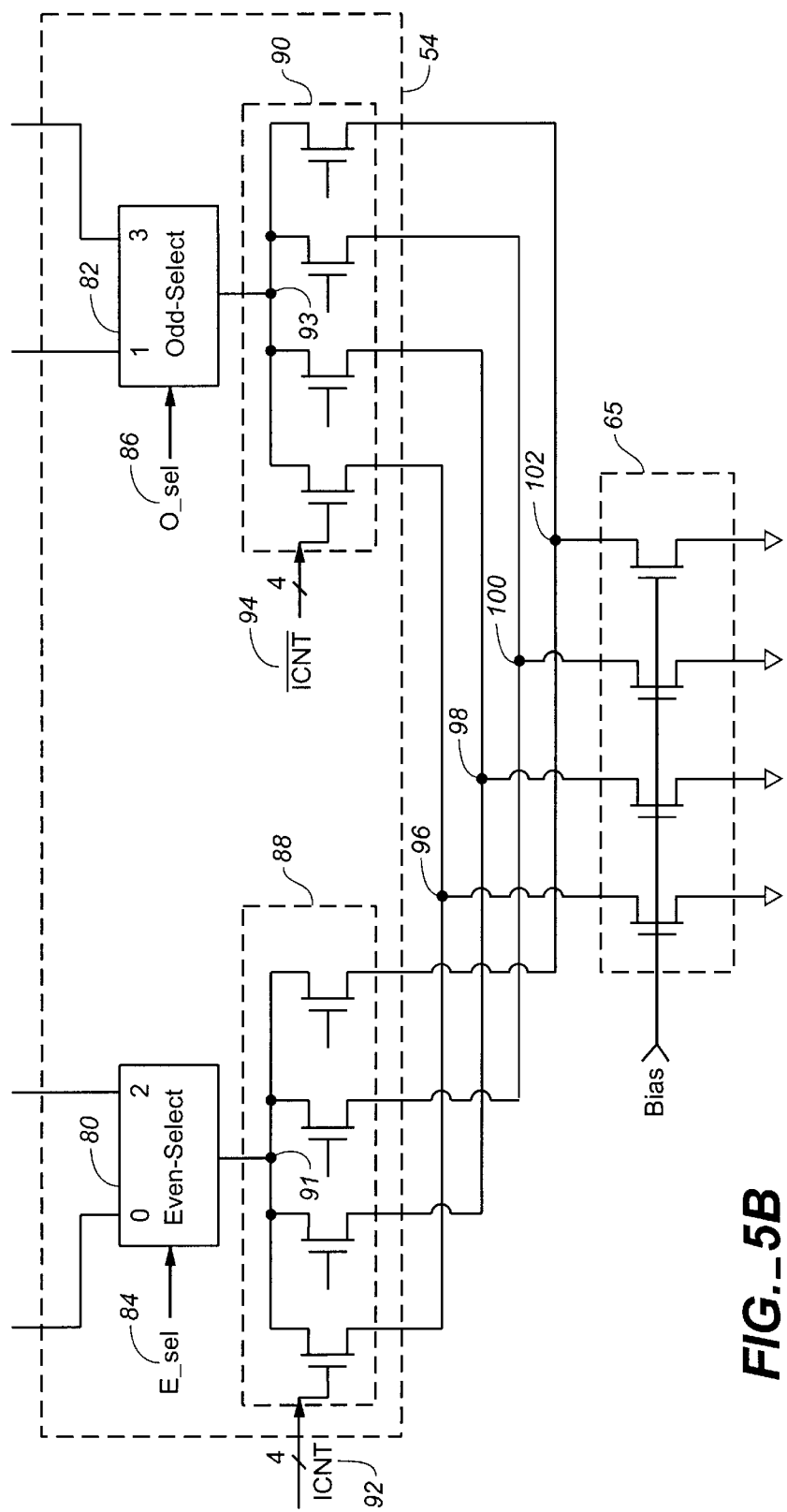
FIG._5B

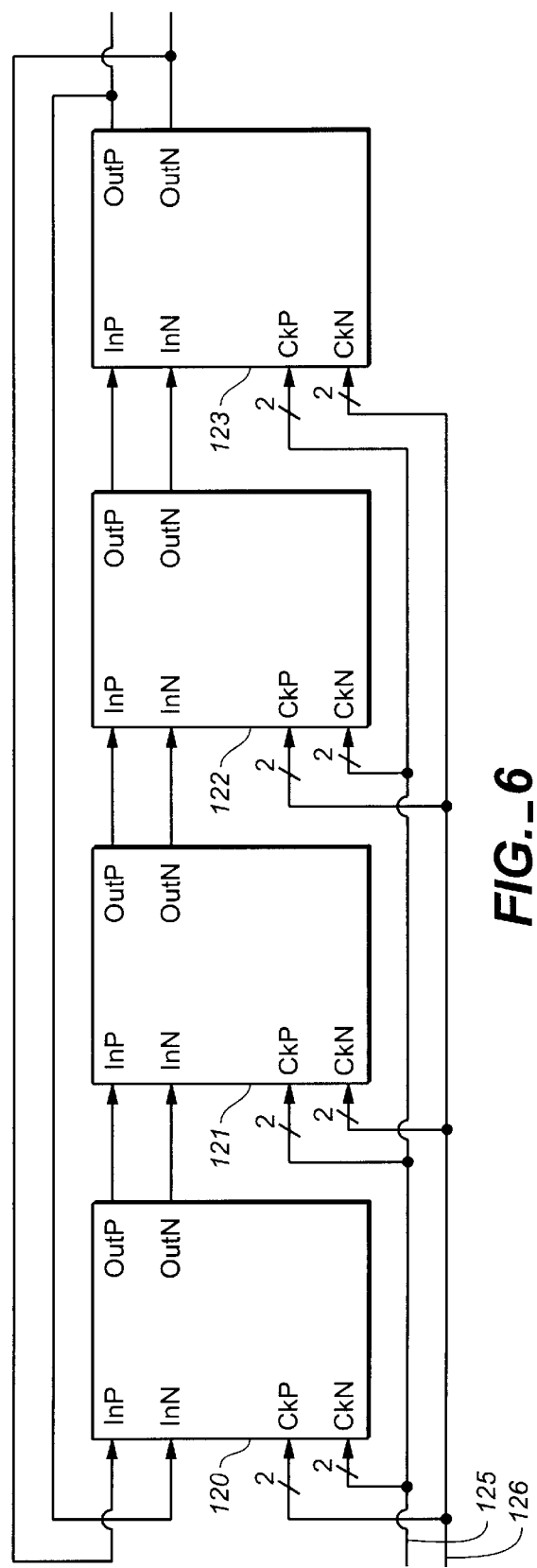
FIG._6

DIVIDE-BY-N DIFFERENTIAL PHASE INTERPOLATOR

FIELD OF THE INVENTION

The present invention relates to circuits that can be used for interpolating between two discrete phase signals, for example from a voltage controlled oscillator (VCO).

BACKGROUND ART

Clock recovery circuits (CRC) are typically employed in the telecommunications industry to extract clock information from serially transmitted data streams. FIG. 1 follows a description in a book entitled, "Phase-Locked Loops: Design, Simulation and Applications", p. 2, by Roland Best. In FIG. 1, a typical CRC 18 includes a phase detector 12, a loop filter 14, and a VCO 16. The phase detector 12 detects the phase difference between an incoming reference data stream 10 and that of an output signal 20 from the VCO 16 and issues adjustment signal 22 for the VCO 16. Once the adjustment signal 22 has been filtered through the loop filter 14, it feeds into the VCO 16 to modify its output 20 in a way such as to minimize the phase difference between its output 20 and that of the reference data stream 10.

One of the factors that influences how well the synthesized frequency 20 approximates the actual clock frequency in the incoming reference data stream 10 is the phase resolution of the VCO 16, which is typically determined by the number of delay stages inside the VCO. These delay stages are sometimes implemented by connecting a series of delay elements together to form a ring oscillator. For example, in FIG. 2, a two-stage ring oscillator of the prior art having four output phases is illustrated. The delay elements 24 in the two-stage ring oscillator 22 are designed in a way such that the phase of a signal 23 is delayed by 90 degrees every time the signal 23 goes through one of the delay elements 24. Since each delay element 24 also produces a complementary signal 25 that is 180 degrees out of phase with its main signal 23, a ring oscillator 22 with two delay elements 24 will produce four output phases. In order to attain a higher phase resolution, one can increase the number of delay elements 24 in the ring oscillator 22. For instance, adding three delay elements 24 to the above mentioned ring oscillator 22 would generate six additional phases for output selection.

However, as the speed of data transmission increases, the demand for shorter delay time heightens. For example, to generate a clock frequency of 1.5625 GHz with 64-phase element resolution, a ring oscillator would need to have 32 delay elements with each delay element having a propagation delay of only 20 picoseconds (ps). Moreover, the 64 outputs from the ring oscillator would have to be routed to a multiplexer, which would then have to switch between these outputs without adversely affecting the clock frequency. In addition, the 20 ps time resolutions have to be preserved throughout the routing of the output lines and the multiplexing. These high-speed requirements would require a large amount of power dissipation and are quite incompatible with most current commercial semiconductor processes. As a result, for high-speed data transmission, phase interpolators that can interpolate between discrete clock phases, and thus increase the resolution of the CRC, are used.

U.S. Pat. No. 6,122,336 to Anderson discloses a phase interpolator that doubles the total number of phases available from the VCO by inserting an additional phase between two adjacent phase outputs. However, in order to double the resolution again, an additional phase interpolator would be needed. To generate a 64-phase element resolution output from a 4-phase input would require 4 such interpolators.

A paper entitled "A Semi-Digital Dual Locked Loop" by Stefanos Sidiropoulos and Mark Horowitz published in the November 1997 issue of IEEE Journal of Solid State Circuits teaches a phase interpolator that receives two clock signals and generates a third clock whose phase is the weighted sum of the two input phases. The weighting ratio is controlled by a digital circuit through a bus signal and its output resolution is determined by the number of control bits used. To achieve a resolution of 16 phase elements between two discrete input phases, a 4-bit control signal is required.

Since a reduction in the number of control bits can significantly reduce the complexity of the controlling circuit, and can thus reduce the semiconductor chip area used, it would be desirable to reduce the number of control bits without reducing the phase resolution. Therefore, an objective of the present invention is to teach a phase interpolator that provides a $2^m$ phase element resolution using a control signal that contain less than m bits.

SUMMARY OF THE INVENTION

The above object has been achieved by a phase interpolator having a plurality of differential latches joined together to form a multi-stage circuit that slows down an incoming signal frequency by a factor proportional to the number of stages in the circuit. This enables the use of a faster clock as an input and makes possible the reduction in the number of control bits. For instance, a circuit with two stages will perform a divide-by-2 operation on its input. Consequently, to generate a clock frequency of 1.5625 GHz, a clock running at 3.125 GHz can be used. Since phase interpolation is performed at a doubled clock speed, the number of clock phases available will be doubled once the signal proceeds through the divide-by-2 phase interpolator. In FIG. 3, a timing diagram of a first input signal 110, a second input signal 112, and an output signal 114 of a phase interpolator of the present invention is shown. The first input signal 110 and the second input signal 112 are 90 degrees out of phase. As an example, FIG. 3 shows eight divisions between the input signals 110, 112, which imply that the overall phase element resolution is 32. However, the 32-phase element resolution in the input signals 110, 112 is transformed into a 64-phase element resolution in the output signal 114 because the clock cycle in the output is twice as long as the clock cycle in the inputs. Suppose that the desired output is a 1.5625 GHz clock with an overall 64-phase element resolution. Given a 1.5625 GHz 4-phase clock input, a conventional phase interpolator would need a 4-bit control signal to produce a stepwise resolution of 16 phase elements between any two adjacent input phases. Using the divide-by-2 phase interpolator of the present invention, a 3.125 GHz 4-phase clock could be used and only 3 control bits would be needed to generate a 1.5625 GHz clock with an overall resolution of 64 phase elements. With a divide-by-4 phase interpolator, a 6.25 GHZ 4-phase clock could be used and only 2 control bits would be needed.

BRIEF DESCRIPTION OF THE DRAWINGS

FIG. 1 is a block diagram of a clock signal recovery circuit of the prior art.

FIG. 2 is a circuit diagram of a ring oscillator in accordance with the prior art.

FIG. 3 is a timing diagram of input signals and an output signal in a phase interpolator of the present invention.

FIG. 4 is a block diagram of a divide-by-2 phase interpolator of the present invention.

FIG. 5, which includes FIGS. 5A and 5B, is an electrical schematic diagram of the preferred embodiment of a differential latch used in the phase interpolator of the present invention.

FIG. 6 is a block diagram of another embodiment of a phase interpolator of the present invention having four latch circuits.

BEST MODE FOR CARRYING OUT THE INVENTION

With reference to FIG. 4, a divide-by-2 differential phase interpolator is made up of first differential latches 30 and second differential latches 32. Each differential latch includes first input 34 and second input 36, which constitute a differential input pair, and first output 38 and second output 40, which constitute a differential output pair. Since the second input 36 and second output 40 are the complements of the first input 34 and first output 38 respectively, hereinafter, in order to be consistent with the general differential pair convention, the first input 34 and first output 38 will be referred to as "the positive input and output" and the second input 36 and second output 40 will be referred to as "the negative input and output".

Referring to FIG. 4, the differential latches are joined together in a ring formation, with the positive output 38 from the first differential latch 30 being connected to the positive input of the second differential latch 32, and the negative output 40 of the first differential latch 30 being connected to the negative input of the second differential latch 32. The positive output of the second differential latch 32 feeds back to the negative input 36 of the first differential latch 30, while the negative output of the second differential latch 32 feeds back to the positive input 34 of the first differential latch 30.

Each differential latch possesses positive and negative differential clock inputs, 42 and 44, respectively and each input carries a signal that has identical frequency but different phases. The ring oscillator in the VCO provides the input clock signals along lines 35 and 37. The positive signal line 35 of the differential clock pair from the VCO is connected to the negative differential clock input 44 of the first differential latch 30 and the positive differential clock input of the second differential latch 32. The negative signal line 37 of the differential clock pair is connected to the positive differential clock input 42 of the first differential latch 30 and the negative differential clock input of the second differential latch 32. The differential output 41 of the second different latch 32 provides a signal whose phase is a weighted average of the phases of the two differential clock signal 35 and 37. The weighting ratio is provided by an interpolation control input line 39, which feeds into both of the first and second differential latches.

A preferred embodiment of the differential latch circuit is shown in FIG. 5. The circuit could be viewed as being composed of four modules: a latching module 50, a clock phase input module 52, a current-steering module 54, and a biasing module 56. The latching module 50 is chiefly a differential latching circuit having first, second, third and fourth NMOS transistors, 62, 64, 66 and 68, respectively. The sources of the first and second NMOS transistors 62 and 64 join together to form a left differential pair 58. The third and fourth NMOS transistors 66 and 68 join together to form a right differential pair 60. Positive negative inputs are applied to the gates of the first and second NMOS transistors respectively. The drains of the first and second transistors 62 and 64 are connected to power supply Vcc through first and second resistors, 70 and 72. A positive output terminal 74 is available at the drain of fourth NMOS transistor 68 and the signal feeds back to the gate of the third NMOS transistor 66 and to the drain of the second NMOS transistor 64. A negative output 76 is available at the drain of the third NMOS transistor 66 and the signal feeds back to the gate of the fourth NMOS transistor 68 and to the drain of the first NMOS transistor 62.

The clock phase input module 52 is made up of left and right banks 51 and 53 of NMOS transistors; each bank consists of a plurality of transistors connected in a parallel fashion. The number of transistors in each bank matches the number of output phases available from the VCO. For example, if the output four phases, then there are four NMOS transistors in each bank. The drains of the NMOS transistors in the left bank join together at a common node 55 that connects to the common source of the left differential pair 58 in the latching module. The drains of the NMOS transistors in the right bank join together in a common node 57 that connects to the common source of the right differential pair 60 in the output module. The sources of the transistors in the left bank join with the sources of their right bank counterpart to form common nodes 59, 61, 63, 65. These common nodes 59, 61, 63, 65 are numbered according to the differential phase clock they are attached to. For instance, with a VCO that produces a 4-phase clock, the input phases would be numbered zero, one, two, and three, which corresponds to phases of 0, 90, 180 and 270 degrees. Subsequently, the common node 59 that joins the sources of transistors 67, 75 whose gates are connected to phase zero will be numbered zero. The common node 61 that joins the sources of the transistors 69, 77 whose gates are connected to the 90 degree phases will be numbered one. The common node 63 that joins the sources of transistors 71, 79 whose gates are connected to phase 180 will be numbered two. And finally, the common node 65 that joins sources of transistors 73, 81 whose gates are connected to phase 270 will be numbered three.

In the control module 54, the even-numbered common nodes 59 and 63 connect to an even select sub-module 80, while the odd-numbered common nodes 61 and 65 connect to an odd select sub-module 82. The function of each select sub-module is to select one of the available phases to conduct current. The selection is based on control signals 84 and 86 from an outside circuit and only adjacent numbers will be selected. For instance, if the number two is chosen in the even select module 80, either a one or a three will be chosen in the odd-select module 82.

The control module 54 also has a pair of current steering sub-modules, which consist of left and right banks, 88 and 90, of NMOS transistors, respectively. These transistors are biased in such a way that they will function in switch mode. Each bank has a number of transistors that is half of the desired number of divisions between two phases. For example, if a 64-phase element resolution was desired from a 4-phase VCO input, the desired number of divisions between each consecutive discrete phases would be 16. Using the divided-by-2 phase interpolator of the present invention, only eight transistors would be needed in each current steering transistor bank. Since the numerical range of 0–15 requires 4 bits to represent while the numerical range of 0–7 only requires 3 bits, by reducing the number of transistors needed in the control bank from 16 to 8, we can reduce the number of control bits from four to three.

The drains of the transistors in the left bank 88 join into one common node 91 that connects to the even-select sub-module 80. The drains of the transistors in the right bank 90 also join at a common node 93 that connects to the odd-select sub-module 82. The gates of the transistors receive incoming control signals on lines 92 and 94 that dictate the switching state of the transistors. The positive version of the control signal on line 92 feeds into the left transistor 88 bank while its complement on line 94 feeds into the right bank 90. In this way, the total amount of current passing through the left and right branches of the circuit is constant since the number of transistors turned on is always equal to the number of transistors turned off.

To illustrate how current is steered by varying the control signals to the two transistor banks, let us assume that the control bus 92 carries a signal 0011 to the left bank. Consequently, 1100 will appear in the right bank 90. Since equal number of transistors is switched on both sides, equal current will go through both banks. Now, if the control bus 92 carries a signal 0001 to the left bank 88, 1110 will appear in the right bank 90. Since only one transistor is switched on in the left bank 88 while three are on in the right, 25% of the current will go through the left bank 88 while 75% will go through the right bank 90. With four transistors in each bank, there are 4 ways to divide up the current, which implies that the phase resolution between discrete phases is 4.

The corresponding sources of the transistors in the left and right current steering sub-modules 88 and 90 are connected together into common nodes 96, 98, 100, 102 and each of the common nodes connects to a biasing transistor in the current biasing module 56. The function of the biasing circuit is to establish an appropriate dc operating point for the transistors.

With reference to FIG. 6, the two-latch embodiment of FIG. 4 can be extended to include additional latch circuits. The phase interpolator of FIG. 6 has a plurality of latch circuit 120–123 (here, for example, four latch circuits) connected in series, including a first latch circuit 120, a last latch circuit 123, and intermediate latch circuits 121 and 122 connected between the first and last latch circuits 120 and 123. Except for the connections between the last and first latch circuits 123 and 120, the positive output OutP of each latch is connected to the positive input InP of the next latch, and the negative-output OutN of each latch is connected to the negative input InN of the next latch. The first and last latch circuits are connected in a cross-coupled manner, with the positive output OutP of the last latch 123 connected to the negative input InP of the first latch 120, and with the negative output OutN of the last latch 123 connected to the positive input InP of the first latch 120. The phase interpolator receives a plurality of clock signals on positive and negative clock signal lines 125 and 126. Each latch circuit is assigned a placement number starting with zero for the first latch circuit 120 and increasing in a consecutive manner until the last latch circuit 123. Each latch circuit having an even placement number, i.e. latches 120 and 122 in this embodiment, has its positive and negative differential clock inputs CkP and CkN coupled to respective clock lines 126 and 125 to receive the negative and positive clock signals respectively. Each latch circuit having an odd placement number, i.e. latchs 121 and 123 in this embodiment, has its positive and negative differential clock inputs CkP and CkN coupled to respective clock lines 125 and 126 to receive the positive and negative clock signals respectively. Each of the latch circuits can be constructed as described above with reference to FIG. 5 to include a plurality of cross-coupled differential transistor pairs for latching the incoming differential signals, phase selection means (e.g., select submodules 80 and 82 in FIG. 5) for selecting two adjacent phase signals, and current steering means (e.g., current steering submodules 88 and 90 in FIG. 5) for distributing current between two of the cross-coupled differential transistor pairs.

What is claimed is:

1. A phase interpolator comprising:
   a plurality of differential latches cross-coupled together to form a divide-by-N circuit having first and second differential input lines with differential input signals of identical frequency but different phases, an differential output line and an interpolation control input line, wherein the differential output from the latches provides an output signal on the output line whose phase is a weighted average of the two different phases of the two input signals on first and second differential input lines, and whose frequency is slower than that of the input signals by a divisional factor of N; the interpolation control input line feeding the divide-by-N circuit with a pre-selected weighting ratio affecting the weight given to each of the two input phases of the two input signals for determining said weighted average.

2. The phase interpolator of claim 1 wherein:
   the plurality of latch circuits are connected in series, including a first latch circuit and a last latch circuit that are connected in a cross-coupled manner, each of the latch circuits having a pair of differential inputs including a positive input and a negative input, and a pair of differential outputs including a positive output and a negative output, the positive output of the first latch circuit being connected to the positive input of a next latch circuit and the negative output of the first latch circuit being connected to the negative input of the next latch circuit, the positive output of the last latch circuit being connected to the negative input of the first latch circuit and the negative output of the last latch circuit being connected to the positive input of the first latch circuit; and
   a positive differential clock input line and a negative differential clock input line feeding each latch circuit.

3. The phase interpolator of claim 1 wherein each of the latch circuits includes a plurality of cross-coupled differential transistor pairs for latching an incoming differential signal, a phase selection means for selecting two adjacent phase signals and a current steering means for distributing current between two of the cross-coupled differential transistor pairs.

4. The phase interpolator of claim 1 wherein the cross-coupled differential transistor pairs are comprised of first, second, third, and fourth transistors, each transistor having a drain, a source and a gate terminal, the first and second transistors being joined at the source terminals to form the first differential pair and the third and fourth transistors being joined at the source terminals to form the second differential pair, wherein positive and negative input terminals are provided at the gate terminals of the first and second transistors respectively, wherein a positive output is available at the drain terminal of the fourth transistor, said positive output having a positive signal that feeds back to both of the gate terminal of the third transistor and the drain terminal of the second transistor, and wherein said negative output is available at the drain terminal of the third transistor, said negative output having a negative signal that feeds back to both of the gate terminal of the fourth transistor and the drain terminal of the first transistor.

5. The phase interpolator of claim 2 wherein the current steering means comprises a bank of parallel connected transistors having drain terminals connected at a common node, having gate terminals connected to a current steering input bus, and having source terminals connected to a biasing circuit.

6. The phase interpolator of claim 2 wherein the plurality of clock signals are received from a voltage controlled oscillator (VCO).

7. A phase interpolator comprising:

a plurality of latch circuits connected in series, including a first latch circuit and a last latch circuit connected in a cross-coupled manner, each of the latch circuits having a pair of differential inputs including a positive input and a negative input, and a pair of differential outputs including a positive output and a negative output, the positive output of the first latch circuit being connected to the positive input of a next latch circuit and the negative output of the first latch circuit being connected to the negative input of the next latch circuit, the positive output of the last latch circuit being connected to the negative input of the first latch circuit and the negative output of the last latch circuit being connected to the positive input of the first latch circuit; and a first differential clock input and a second differential clock input line feeding each latch circuit;

a interpolation control input line feeding into every latch circuit with a pre-selected weighting ratio affecting the weight given to each of the differential clock input signal.

8. The phase interpolator of claim 7 wherein each latch circuit is assigned a placement number, said placement numbers starting with zero for the first latch circuit and increasing in a consecutive manner until the last latch circuit, wherein each latch circuit having an even placement number has the positive and negative differential clock inputs coupled to receive the negative and positive clock signals respectively, and wherein each latch circuit having an odd placement number has the positive and negative differential clock inputs coupled to receive the positive and negative clock signals respectively.

9. The phase interpolator of claim 7 wherein each of the latch circuits includes a plurality of cross-coupled differential transistor pairs for latching an incoming differential signal, a phase selection means for selecting two adjacent phase signals and a current steering means for distributing current between two of the cross-coupled differential transistor pairs.

10. The phase interpolator of claim 9 wherein the cross-coupled differential transistor pairs are comprised of first, second, third, and fourth transistors, each transistor having a drain, a source and a gate terminal, the first and second transistors being joined at the source terminals to form the first differential pair and the third and fourth transistors being joined at the source terminals to form the second differential pair, wherein positive and negative input terminals are provided at the gate terminals of the first and second transistors respectively, wherein a positive output is available at the drain terminal of the fourth transistor, said positive output having a positive signal that feeds back to both of the gate terminal of the third transistor and the drain terminal of the second transistor, and wherein said negative output is available at the drain terminal of the third transistor, said negative output having a negative signal that feeds back to both of the gate terminal of the fourth transistor and the drain terminal of the first transistor.

11. The phase interpolator of claim 9 wherein the current steering means comprises a bank of parallel connected transistors having drain terminals connected at a common node, having gate terminals connected to a current steering input bus, and having source terminals connected to a biasing circuit.

12. The phase interpolator of claim 7 wherein the plurality of clock signals are received from a voltage controlled oscillator (VCO).

13. A phase interpolator comprising:

means for receiving a plurality of clock signals, including a positive clock signal line and a negative clock signal line;

a plurality of latch circuits connected in series, including a first latch circuit and a last latch circuit that are connected in a cross-coupled manner, and a plurality of intermediate latch circuits connected between the first latch circuit and the last circuit, each latch circuit including a positive differential clock input line and a negative differential clock input line, each latch circuit being assigned a placement number starting with zero for the first latch circuit and increasing in a consecutive manner until the last latch circuit, wherein each latch circuit having an even placement number has the positive and negative differential clock inputs coupled to receive the negative and positive clock signals respectively, wherein each latch circuit having an odd placement number has the positive and negative differential clock inputs coupled to receive the positive and negative clock signals respectively, and wherein each of the latch circuits includes a plurality of cross-coupled differential transistor pairs for latching an incoming differential signal, a phase selection means for selecting two adjacent phase signals and a current steering means for distributing current between two of the cross-coupled differential transistor pairs.

14. The phase interpolator of claim 13 wherein the cross-coupled differential transistor pairs are comprised of first, second, third, and fourth transistors, each transistor having a drain, a source and a gate terminal, the first and second transistors being joined at the source terminals to form the first differential pair and the third and fourth transistors being joined at the source terminals to form the second differential pair, wherein positive and negative input terminals are provided at the gate terminals of the first and second transistors respectively, wherein a positive output is available at the drain terminal of the fourth transistor, said positive output having a positive signal that feeds back to both of the gate terminal of the third transistor and the drain terminal of the second transistor, and wherein said negative output is available at the drain terminal of the third transistor, said negative output having a negative signal that feeds back to both of the gate terminal of the fourth transistor and the drain terminal of the first transistor.

15. The phase interpolator of claim 13 wherein the current steering mean comprises a bank of parallel connected transistors having drain terminals connected at a common node, having gate terminals connected to a current steering input bus, and having source terminals connected to a biasing circuit.

16. The phase interpolator of claim 13 wherein the plurality of clock signals are received from a voltage controlled oscillator.

* * * * *